United States Patent
Xiao et al.

(10) Patent No.: US 10,658,379 B2
(45) Date of Patent: May 19, 2020

(54) ARRAY COMMON SOURCE STRUCTURES OF THREE-DIMENSIONAL MEMORY DEVICES AND FABRICATING METHODS THEREOF

(71) Applicant: Yangtze Memory Technologies Co., Ltd., Wuhan, Hubei (CN)

(72) Inventors: Li Hong Xiao, Hubei (CN); Zhenyu Lu, Hubei (CN); Qian Tao, Hubei (CN); Lan Yao, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/126,415

(22) Filed: Sep. 10, 2018

(65) Prior Publication Data
US 2019/0103415 A1 Apr. 4, 2019

Related U.S. Application Data

(63) Continuation of application No. PCT/CN2018/099297, filed on Aug. 8, 2018.

(51) Int. Cl.
*H01L 27/11582* (2017.01)
*H01L 21/768* (2006.01)
(Continued)

(52) U.S. Cl.
CPC .. *H01L 27/11582* (2013.01); *H01L 21/76883* (2013.01); *H01L 23/53271* (2013.01);
(Continued)

(58) Field of Classification Search
CPC .......... H01L 27/11582; H01L 27/1157; H01L 29/41741; H01L 29/41791;
(Continued)

(56) References Cited

U.S. PATENT DOCUMENTS 5,473,184 A   12/1995 Murai
8,697,518 B2   4/2014 Ji et al.
(Continued)

FOREIGN PATENT DOCUMENTS

CN   101924130 A   12/2010
CN   103839999 A    5/2014
(Continued)

OTHER PUBLICATIONS

International Search Report and Written Opinion of the International Searching Authority directed to related International Patent Application No. PCT/CN2018/099297, dated Sep. 20, 2018; 7 pages.
(Continued)

*Primary Examiner* — Scott B Geyer
(74) *Attorney, Agent, or Firm* — Sterne, Kessler, Goldstein & Fox P.L.L.C.

(57) ABSTRACT

A method for forming a 3D memory device is disclosed. The method comprises: forming an alternating conductive/dielectric stack on a substrate; forming a slit vertically penetrating the alternating conductive/dielectric stack; forming an isolation layer on a sidewall of the slit; forming a first conductive layer covering the isolation layer; performing a plasma treatment followed by a first doping process to the first conductive layer; forming a second conductive layer covering the first conductive and filling the slit; performing a second doping process followed by a rapid thermal crystallization process to the second conductive layer; removing an upper portion of the first conductive layer and the second conductive layer to form a recess in the slit; and forming a third conductive layer in the recess.

20 Claims, 10 Drawing Sheets

(51) Int. Cl.
*H01L 23/532* (2006.01)
*H01L 27/1157* (2017.01)
*H01L 21/02* (2006.01)
*H01L 21/285* (2006.01)

(52) U.S. Cl.
CPC ...... *H01L 27/1157* (2013.01); *H01L 21/0262* (2013.01); *H01L 21/02532* (2013.01); *H01L 21/02595* (2013.01); *H01L 21/02667* (2013.01); *H01L 21/28568* (2013.01)

(58) Field of Classification Search
CPC ......... H01L 21/02532; H01L 21/02595; H01L 21/0262; H01L 21/02667; H01L 21/28568
See application file for complete search history.

(56) References Cited

U.S. PATENT DOCUMENTS

| | | |
|---|---|---|
| 9,099,348 B2 | 8/2015 | Lee et al. |
| 9,455,270 B1 | 9/2016 | Lai |
| 9,490,349 B1 | 11/2016 | Yang et al. |
| 10,199,389 B2 * | 2/2019 | Kim ................... H01L 23/5283 |
| 2011/0076819 A1 | 3/2011 | Kim et al. |
| 2015/0104916 A1 * | 4/2015 | Lee ..................... H01L 27/1157 |
| | | 438/268 |
| 2016/0093634 A1 * | 3/2016 | Jang ...................... H01L 29/495 |
| | | 257/324 |
| 2016/0126253 A1 * | 5/2016 | Lee ..................... H01L 27/1157 |
| | | 257/324 |
| 2016/0141294 A1 | 5/2016 | Peri et al. |
| 2017/0012051 A1 | 1/2017 | Lee et al. |
| 2017/0025432 A1 | 1/2017 | Yune |
| 2017/0221813 A1 * | 8/2017 | Kim ................... H01L 23/5226 |
| 2018/0026050 A1 * | 1/2018 | Lee ..................... H01L 29/7926 |
| | | 257/314 |

FOREIGN PATENT DOCUMENTS

| | | |
|---|---|---|
| CN | 104576538 A | 4/2015 |
| CN | 106206322 A | 12/2016 |
| CN | 106298676 A | 1/2017 |
| JP | 2009/170571 A | 7/2009 |

OTHER PUBLICATIONS

Chinese Application No. 201880005197.4, Office Action dated Jan. 20, 2020; English Translation from EPO Global Dossier, 8 pages.
Taiwanese Application No. 107127826, Office Action dated Dec. 20, 2019; 5 pages.

* cited by examiner

ARRAY COMMON SOURCE STRUCTURES OF THREE-DIMENSIONAL MEMORY DEVICES AND FABRICATING METHODS THEREOF

CROSS-REFERENCE TO RELATED APPLICATIONS

This application claims priority to PCT/CN2018/099297 filed on Aug. 8, 2018, which claims priority to Chinese Patent Application No. 201710775892.6, filed on Aug. 31, 2017, the entire contents of which are incorporated herein by reference.

TECHNICAL FIELD

The present disclosure generally relates to the field of semiconductor technology, and more particularly, to array common source structures of three-dimensional (3D) memory devices and fabricating methods thereof.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As such, memory density for planar memory cells approaches an upper limit. A three-dimensional (3D) memory architecture can address the density limitation in planar memory cells.

In some existing 3D memory devices, such as 3D NAND memory devices, the memory cell array includes multiple strings of transistors. Each of these strings typically includes at least one row select transistor, multiple memory cell transistors, and one ground select transistor that are connected in series with each other. The source region of the ground selection transistor is electrically connected to a common source line (CSL). The CSL connecting structure is generally formed by depositing metal tungsten into a common source contact hole. Due to the high stress of the metal tungsten, the stress of the 3D NAND memory device may not be even, resulting in various serious process problems, such as wafer warpage, lithography defocusing, cladding misalignment, etc. that are induced by the wafer sliding during the fabricating process.

BRIEF SUMMARY

Embodiments of a method for forming three-dimensional (3D) memory devices are disclosed herein.

One aspect of the present disclosure provides a method for forming a three-dimensional (3D) memory device, comprising: forming an alternating conductive/dielectric stack on a substrate; forming a slit vertically penetrating the alternating conductive/dielectric stack; forming an isolation layer on a sidewall of the slit; forming a first conductive layer covering the isolation layer; performing a plasma treatment followed by a first doping process to the first conductive layer; forming a second conductive layer covering the first conductive and filling the slit; performing a second doping process followed by a rapid thermal crystallization process to the second conductive layer; removing an upper portion of the first conductive layer and the second conductive layer to form a recess in the slit; and forming a third conductive layer in the recess.

In some embodiments, forming the alternating conductive/dielectric stack comprises: forming at least 32 conductive/dielectric layer pairs stacked in a vertical direction, wherein each conductive/dielectric layer pair includes a conductive layer and a dielectric layer. In some embodiments, forming the alternating conductive/dielectric stack comprises: forming at least 32 conductive/dielectric layer pairs stacked in a vertical direction, wherein each conductive/dielectric layer pair includes a tungsten layer and a silicon oxide layer.

In some embodiments, the method further comprises: forming an array of channel structures, each vertically penetrating the first alternating conductive/dielectric stack; and forming a plurality of silts extending in a horizontal direction in parallel with each other to separate the array of channel structures into a plurality of subsets.

In some embodiments, forming the array of channel structures comprises: forming an array of channel holes, each vertically penetrating the alternating conductive/dielectric stack; forming an epitaxial layer at a bottom of each channel hole; forming a functional layer on a sidewall of each channel hole; forming a channel layer covering a sidewall of the functional layer, the channel layer being in contact with the epitaxial layer in each channel hole; and forming a filling structure covering a sidewall of the channel layer and filling each channel hole.

In some embodiments, the method further comprises: forming a doped region at a bottom of the slit.

In some embodiments, forming the first conductive layer comprises: using a low pressure chemical vapor deposition (LPCVD) process to form a first polysilicon layer.

In some embodiments, forming the first conductive layer further comprises: using a mixture of silane and hydrogen diluted with argon or nitrogen as a precursor gas for the LPCVD process; and using a batch furnace as a heating furnace of the LPCVD process set to a reaction temperature in a range from about 400° C. to about 800° C. and a chamber pressure to a range from about 0.1 Torr to about 1 Torr.

In some embodiments, performing the plasma treatment followed by the first doping process to the first conductive layer comprises: performing a $NH_3$ plasma treatment to the first polysilicon layer; and performing a first heavy doping process to the first polysilicon layer with arsenic ions or boron ions.

In some embodiments, performing the $NH_3$ plasma treatment to the first polysilicon layer comprises: performing a plasma-enhanced chemical vapor deposition furnace at a temperature in a range from about 300° C. to 600° C.

In some embodiments, forming the second conductive layer comprises: after the doping process to the first conductive layer, using a low pressure chemical vapor deposition (LPCVD) process to form a second polysilicon layer to cover the first conductive and filling the slit.

In some embodiments, performing the second doping process followed by the rapid thermal crystallization process to the second conductive layer comprises: performing a second heavy doping process to the second polysilicon layer with arsenic ions or boron ions; and performing a spike annealing process or a flash annealing process to the doped second conductive layer.

In some embodiments, performing a spike annealing process or a flash annealing process to the doped second conductive layer comprises: performing a spike annealing process or a flash annealing process at a temperature ranging from about 800° C. to about 1200° C., such that the arsenic or boron ions dopant is effectively activated and the second polysilicon layer is partially crystallized.

In some embodiments, performing a spike annealing process or a flash annealing process to the doped second conductive layer comprises: performing a spike annealing process first and a flash annealing process second to the doped second conductive layer; or performing a flash annealing process first and a spike annealing process second to the doped second conductive layer.

In some embodiments, the method further comprises: after removing the upper portion of the first conductive layer and the second conductive layer to form the recess in the slit, performing a compensation doping process to a remaining portion of the first conductive layer and the second conductive layer.

In some embodiments, the compensation doping process comprises: performing a heavy doping process to the remaining portion of the first conductive layer and the second conductive layer with arsenic ions or boron ions.

In some embodiments, forming the third conductive layer in the recess comprises: depositing a tungsten layer in the recess; and performing a chemical mechanical polishing process to planarize a top surface of the tungsten layer.

Another aspect of the present disclosure provides a three-dimensional (3D) memory device, comprising: an alternating conductive/dielectric stack on a substrate; a slit vertically penetrating the alternating conductive/dielectric stack; an isolation layer on a sidewall of the slit; a common source structure in the slit including: a lower portion including: a first conductive layer covering the isolation layer, the first conductive layer being treated by a plasma treatment followed by a doping process, and a second conductive layer covering the first conductive and filling the slit, the second conductive layer being treated by a doping process followed by a rapid thermal crystallization process; and an upper portion including a third conductive layer.

In some embodiments, the alternating conductive/dielectric stack comprises: at least 32 conductive/dielectric layer pairs stacked in a vertical direction, wherein each conductive/dielectric layer pair includes a conductive layer and a dielectric layer. In some embodiments, the alternating conductive/dielectric stack comprises: at least 32 conductive/dielectric layer pairs stacked in a vertical direction, wherein each conductive/dielectric layer pair includes a tungsten layer and a silicon oxide layer.

In some embodiments, the device further comprises: an array of channel structures, each vertically penetrating the first alternating conductive/dielectric stack; and a plurality of slits extending in a horizontal direction in parallel with each other to separate the array of channel structures into a plurality of subsets.

In some embodiments, each channel structures comprises: a channel hole vertically penetrating the alternating conductive/dielectric stack; an epitaxial layer at a bottom of each channel hole; a functional layer on a sidewall of each channel hole; a channel layer covering a sidewall of the functional layer and being in contact with the epitaxial layer; and a filling structure covering a sidewall of the channel layer and filling the channel hole.

In some embodiments, the device further comprises: a doped region at a bottom of the slit.

In some embodiments, the first conductive layer is a first polysilicon layer including arsenic ions or boron ions. The second conductive layer is a second polysilicon layer including arsenic ions or boron ions and at least partially crystallized. The third conductive layer is a tungsten layer.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
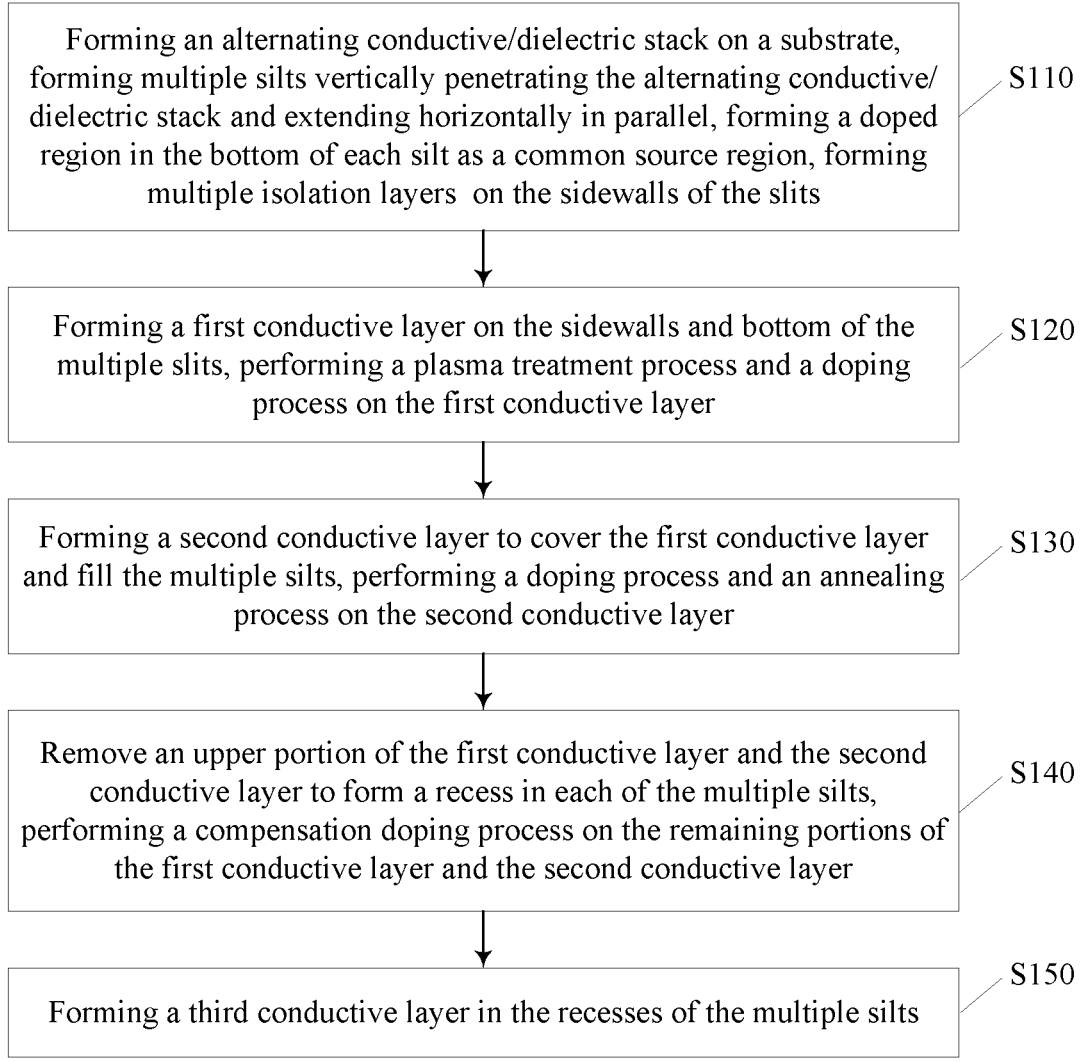
FIG. 1 illustrates a flow diagram of an exemplary method for forming an array common source structure of 3D memory device in accordance with some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (e.g., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

Various embodiments in accordance with the present disclosure provide methods for forming array common source structures of 3D memory devices. Each common source structure formed by the disclosed method can comprise a lower portion of polysilicon and an upper portion of tungsten. The lower portion can be heavily doped and crystallized by rapid thermal annealing. The disclosed method for forming the array common source structure can significantly reduce wafer stress and effectively improve conductivity and device mobility of the common source of the polysilicon.

Referring to FIG. 1, a flow diagram of an exemplary method for forming an array common source structure of 3D memory device is shown in accordance with some embodiments of the present disclosure. FIGS. 2A-2E illustrate cross-sectional views of an exemplary 3D memory device at certain fabricating stages of the method shown in FIG. 1.

As shown in FIG. 1, the method can start at operation S110, in which an alternating conductive/dielectric stack can be formed on a substrate. Multiple channel structures can be formed in the alternating conductive/dielectric stack and arranged in an array. Multiple slits vertically penetrating the alternating conductive/dielectric stack can be formed, which can extended horizontally in parallel with each other. A doped region can be formed in the bottom of each slit as a common source region. Multiple isolation layers can be formed on the sidewalls of the slits.

Figure 2A:
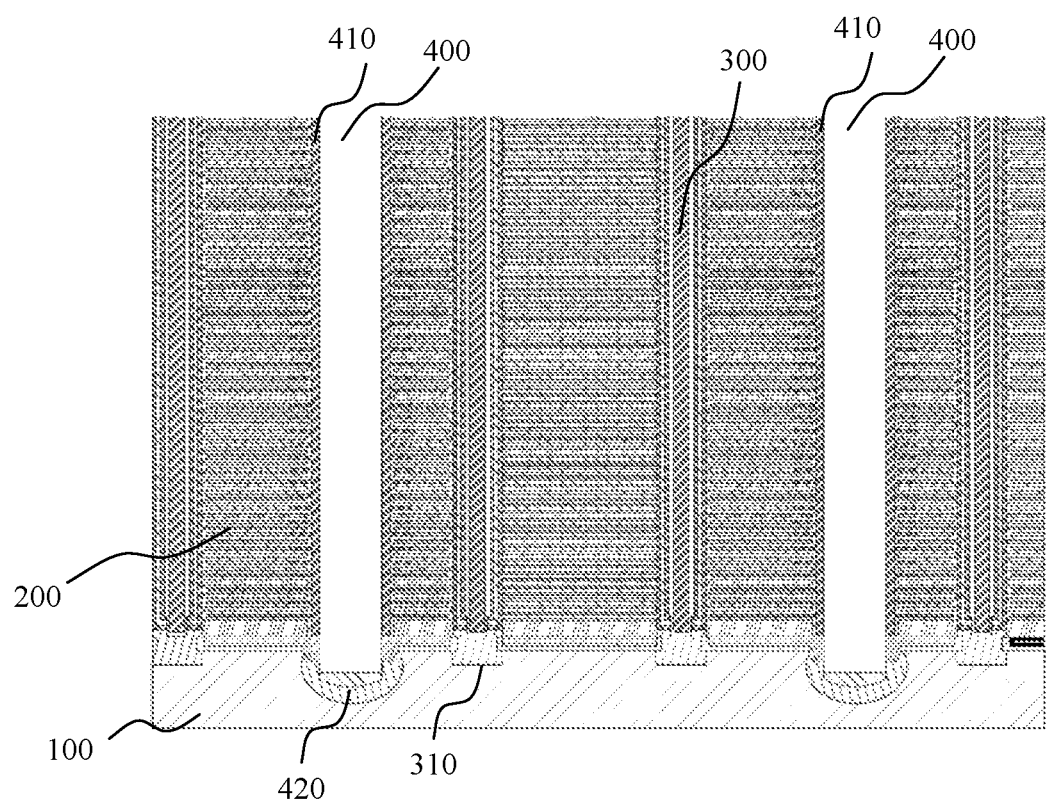
FIGS. 2A-2E illustrate cross-sectional views of an exemplary 3D memory device at certain fabricating stages of the method shown in FIG. 1.

In some embodiments, a fabricating process for forming the alternating conductive/dielectric stack can include the following processes. As shown in FIG. 2A, an alternating dielectric stack including a plurality of dielectric layer pairs can be formed on the substrate 100. The substrate 100 can be any suitable semiconductor substrate having any suitable structure, such as a monocrystalline single-layer substrate, a polycrystalline silicon (polysilicon) single-layer substrate, a polysilicon and metal multi-layer substrate, etc. Each dielectric layer pairs of the alternating dielectric stack can comprise an alternating stack of a first dielectric layer and a second dielectric layer that is different from first dielectric layer. In some embodiments, the first dielectric layers can be used as insulating layers, and the second dielectric layers can be used as sacrificial layers, which are to be replaced with conductive layers in the subsequent processes. After the second dielectric layers are replaced with the conductive layers, the alternating dielectric stack can be converted to alternating conductive/dielectric stack 200, as shown in FIG. 2A. In some embodiments, the plurality of first dielectric layers and second dielectric layers are extended in a lateral direction that is parallel to a surface of the substrate. The alternating dielectric stack can be formed by one or more thin film deposition processes including, but not limited to, Chemical Vapor Deposition (CVD), Physical Vapor Deposition (PVD), Atomic Layer Deposition (ALD), or any combination thereof.

In some embodiments, the alternating dielectric stack can include a plurality of oxide/nitride layer pairs. Each dielectric layer pair includes a layer of silicon oxide and a layer of silicon nitride. The plurality of oxide/nitride layer pairs are also referred to herein as an "alternating oxide/nitride stack." That is, in the alternating dielectric stack, multiple oxide layers and multiple nitride layers alternate in a vertical direction. In other words, except for a top and a bottom layer of a given alternating oxide/nitride stack, each of the other oxide layers can be sandwiched by two adjacent nitride layers, and each of the nitride layers can be sandwiched by two adjacent oxide layers.

Oxide layers can each have the same thickness or have different thicknesses. For example, a thickness of each oxide layer can be in a range from about 10 nm to about 150 nm. Similarly, nitride layers can each have the same thickness or have different thicknesses. For example, a thickness of each nitride layer can be in a range from about 10 nm to about 150 nm. In some embodiments, a total thickness of the alternating dielectric stack can be larger than 1000 nm.

Moreover, the oxide layers and/or nitride layers can include any suitable oxide materials and/or nitride materials. For example, the element of the oxide materials and/or nitride materials can include, but not limited to, tungsten (W), cobalt (Co), copper (Cu), aluminum (Al), doped silicon, silicides, or any combination thereof. In some embodiments, the oxide layers can be silicon oxide layers, and the nitride layers can be silicon nitride layer.

The alternating dielectric stack can include any suitable number of layers of the oxide layers and the nitride layers. In some embodiments, a total number of layers of the oxide layers and the nitride layers in the alternating dielectric stack is equal to or larger than 64. That is, a number of oxide/nitride layer pairs can be equal to or larger than 32. In some embodiments, alternating oxide/nitride stack includes more oxide layers or more nitride layers with different materials and/or thicknesses than the oxide/nitride layer pair. For example, a bottom layer and a top layer in the alternating dielectric stack can be oxide layers.

As shown in FIG. 2A, multiple channel structures 300 can be formed in the alternating dielectric stack. Each channel structure can include a channel hole extending vertically through the alternating dielectric stack, an epitaxial layer on the bottom of the channel hole, a functional layer on the sidewall of the channel hole, and a channel layer between the functional layer and a filling structure. The multiple channel structures can be arranged as an array in the alternating dielectric stack.

In some embodiments, fabrication processes to form the channel structure include forming a channel hole that extends vertically through the alternating dielectric stack. The channel hole can have a high aspect ratio, which is a ratio of a diameter of the channel hole to a depth of the channel hole. The channel hole can be formed by etching the alternating dielectric stack, and a subsequent cleaning process. The etching process to form the channel hole can be a wet etching, a dry etching, or a combination thereof.

In some embodiments, fabrication processes to form the channel structure comprise forming an epitaxial layer 310 on the bottom of the channel hole. The epitaxial layer 310 can be formed on the bottom of the channel hole and on substrate 100 that is exposed by channel hole. In some embodiments, the epitaxial layer 310 can be a polycrystalline silicon (polysilicon) layer formed by using a selective epitaxial growth (SEG) process. In some embodiments, the epitaxial layer 310 may not be directly formed on the surface of substrate 100. One or more layers can be formed between the epitaxial layer and substrate 100. That is, the epitaxial layer overlays substrate 100. A top surface of the epitaxial layer 310 can be higher than a bottom surface of the bottom first dielectric layer.

In some embodiments, fabrication processes to form the channel structure comprise forming a functional layer on the sidewall of the channel hole. The functional layer can be a composite dielectric layer, such as a combination of a barrier layer, a storage layer, and a tunneling layer. The functional layer, including the barrier layer, the storage layer, and the tunneling layer, can be formed by one or more thin film deposition processes, such as ALD, CVD, PVD, any other suitable processes, or any combination thereof.

The barrier layer can be formed between the storage layer and the sidewall of the channel hole. The barrier layer can be used for blocking the outflow of the electronic charges. In some embodiments, the barrier layer can be a silicon oxide layer or a combination of silicon oxide/silicon nitride/silicon oxide (ONO) layers. In some embodiments, the barrier layer includes high dielectric constant (high-k) dielectrics (e.g., aluminum oxide). In some embodiments, a thickness of the barrier layer can be in a range from about 3 nm to about 20 nm.

The storage layer can be formed between the tunneling layer and the barrier layer. Electrons or holes from the channel layer can tunnel to the storage layer through the tunneling layer. The storage layer can be used for storing electronic charges (electrons or holes) for memory operation. The storage or removal of charge in the storage layer can impact the on/off state and/or a conductance of the semiconductor channel. The storage layer can include one or more films of materials including, but are not limited to, silicon nitride, silicon oxynitride, a combination of silicon oxide and silicon nitride, or any combination thereof. In some embodiments, the storage layer can include a nitride layer formed by using one or more deposition processes. In some embodiments, a thickness of the storage layer can be in a range from about 3 nm to about 20 nm.

The tunneling layer can be formed on the sidewall of the storage layer. The tunneling layer can be used for tunneling electronic charges (electrons or holes). The tunneling layer can include dielectric materials including, but not limited to, silicon oxide, silicon nitride, silicon oxynitride, or any combination thereof. In some embodiments, the tunneling layer can be an oxide layer formed by using a deposition process. In some embodiments, a thickness of the tunneling layer can be in a range from about 3 nm to about 20 nm.

In some embodiments, fabrication processes to form the channel structure further comprise forming a channel layer covering the sidewall of the functional layer. In some embodiments, the channel layer can be an amorphous silicon layer or a polysilicon layer formed by using a thin film deposition process, such as ALD, CVD, PVD, or any other suitable process. In some embodiments, a thickness of the channel layer can be in a range from about 5 nm to 20 nm.

In some embodiments, fabrication processes to form the channel structure further comprise forming a filling structure to cover the channel layer and fill the channel hole. In some embodiments, the filling structure can be an oxide layer formed by using any suitable deposition process, such as ALD, CVD, PVD, etc. In some embodiments, the filling structure can include one or more airgaps.

As shown in FIG. 2A, multiple gate line slits 400 can be formed in the alternating dielectric stack. Each gate line slit 400 can vertically penetrate through the alternating dielectric stack, and extend substantially in a straight line between two arrays of channel structures. The multiple gate line slits 400 can be formed by forming a mask layer over the alternating dielectric stack and patterning the mask using, e.g., photolithography, to form openings corresponding to the multiple gate line slits in the patterned mask layer. A suitable etching process, e.g., dry etch and/or wet etch, can be performed to remove portions of the alternating dielectric stack exposed by the openings until the multiple expose the substrate 100. The mask layer can be removed after the formation of the multiple gate line slits.

In some embodiments, a gate replacement process (also known as the "word line replacement" process) can be performed to replace second dielectric layers (e.g., silicon nitride) of the alternating dielectric stack with conductive layers (e.g., W). As a result, after the gate replacement process, the alternating dielectric stack can become an alternating conductive/dielectric stack 200, as shown in FIG. 2A.

As described above, the second dielectric layers in the alternating dielectric stack are used as sacrificial layers, and can be removed by used any suitable etching process, e.g., an isotropic dry etch or a wet etch. The etching process can have sufficiently high etching selectivity of the material of the second dielectric layers over the materials of the first dielectric layer, such that the etching process can have minimal impact on the first dielectric layer. The isotropic dry etch and/or the wet etch can remove second dielectric layers in various directions to expose the top and bottom surfaces of each first dielectric layer. As such, multiple horizontal trenches can then be formed between first dielectric layers. In some embodiments, the second dielectric layers comprise silicon nitride and the etchant of the isotropic dry etch includes one or more of $CF_4$, $CHF_3$, $C4F_8$, $C4F_6$, and $CH_2F_2$. The radio frequency (RF) power of the isotropic dry etch can be lower than about 100 W and the bias can be lower than about 10V. In some embodiments, the second dielectric layers include silicon nitride and the etchant of the wet etch includes phosphoric acid.

The multiple conductive layers can be then formed by filling the horizontal trenches with a suitable gate electrode metal material. The gate electrode metal material can fill each horizontal trench to form conductive layers to provide the base material for the subsequently-formed word lines (i.e., gate electrodes). The gate electrode metal material can comprise any suitable conductive material, e.g., tungsten, aluminum, copper, cobalt, or any combination thereof, for forming the word lines (i.e., gate electrodes). The gate electrode material can be deposited into horizontal trenches using a suitable deposition method such as CVD, physical vapor deposition (PVD), plasma-enhanced CVD (PECVD), sputtering, metal-organic chemical vapor deposition (MOCVD), and/or ALD. In some embodiments, the conductive layers include tungsten formed by CVD.

In some embodiments, after forming the multiple conductive layers, portions of the multiple conductive layers close to the slits 400 can be removed. In some embodiments, in order to ensure the insulation between multiple gates, a recess etch can be performed to remove the portions of the multiple conductive layers that are close to the multiple gate line slits 400. In doing so, a recess of the conductive layer can be formed in each trench.

As shown in FIG. 2A, multiple isolation layers 410 can be formed on the sidewalls of the multiple gate line slits 400. The isolation layers 410 can cover the sidewalls of the gate line slits 400 and fill the multiple recesses corresponding to the multiple conductive layers. The isolation layers 410 can be used as isolation spacers for providing electrical isolation between the conductive layers in the alternating conductive/dielectric stack and the conductive walls formed in the subsequent process.

The isolation layers 410 can be formed by a suitable deposition process followed by an etching process. For example, a deposition process, such as sputtering, PVD, MOCVD, Low pressure chemical vapor deposition (LP-CVD), and/or ALD, etc., can be performed to form the isolation layers 410. A material of the isolation layers 410 can include any suitable insulating material, such as silicon oxide, etc. After the isolation layers 410 are formed, an etching process can be performed to remove portions of the isolation layers 410 at the bottom of each gate line slit 400 to expose the substrate 100. A doped region 420 can be formed in the bottom of each slit 400 as a common source region. The doped region 420 can be formed in the substrate 100 under each gate line slit 400 by, for example, by ion implantation and/or thermal diffusion through the gate line slits 400.

It is noted that, in the present disclosure, an X-direction can be defined as a direction that is in a horizontal plane that is parallel to the surface of the substrate 100, and is perpendicular to the cross-sectional surface shown in FIG. 2A. That is, X-direction is the direction that the slits 400 extended along. The Y-direction can be defined as a direction that is in the horizontal plane that is parallel to the surface of the substrate 100, and is parallel to the cross-sectional surface shown in FIG. 2A. In some embodiments, during the operation S110, the wafer may undergo slight stress, causing the substrate 100 and the alternating conductive/dielectric stack 200 to bow within an acceptable range. For example, a wafer bow can be less than about 40 nm in the X-direction, and can be less than about 50 nm in the Y-direction.

Referring back to FIG. 1, the method proceeds to operation S120, in which a first conductive layer can be formed on the sidewalls and bottom of the multiple slits. A plasma treatment process and a doping process can be performed on the first conductive layer.

Figure 2B:
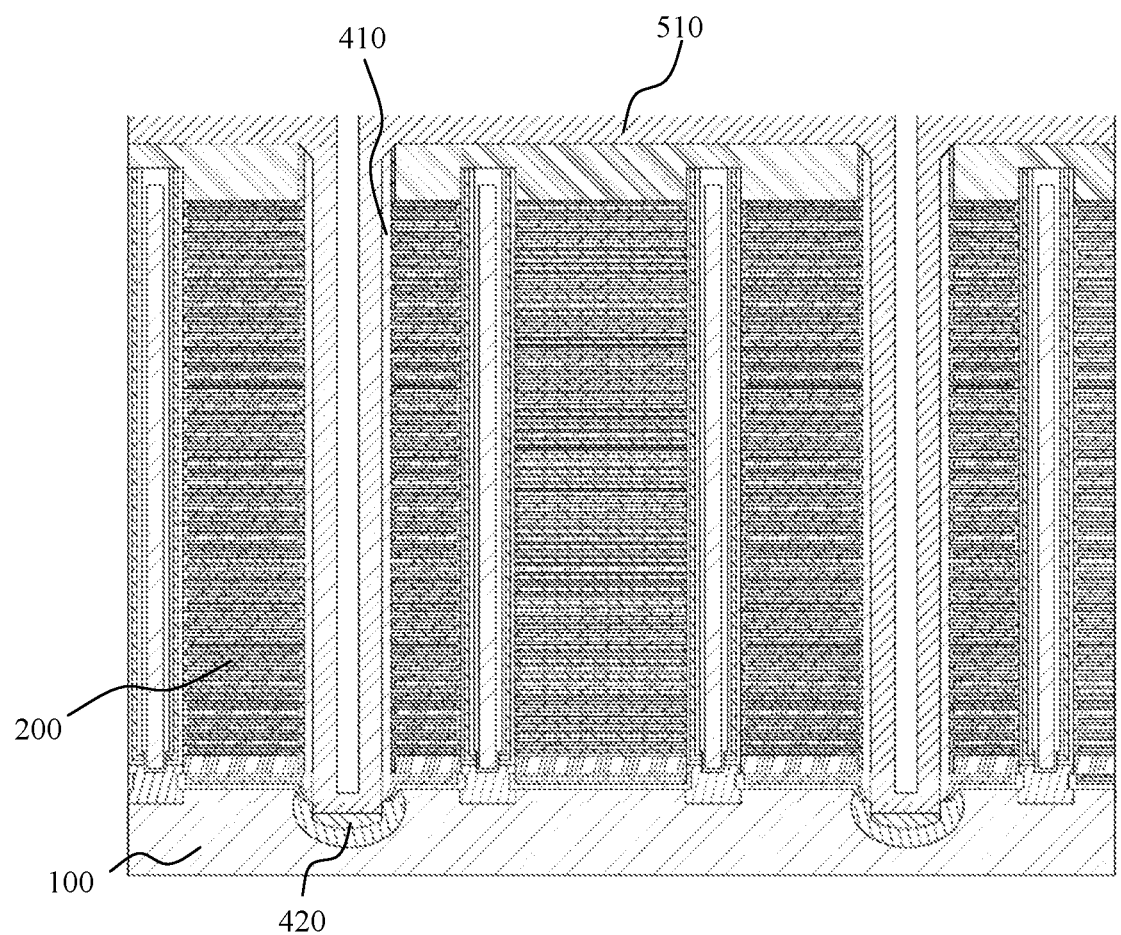

As shown in FIG. 2B, the first conductive layer 510 can be formed on the sidewalls and bottom of the multiple slits 400 to cover the epitaxial layers 310 and the isolation layers 410. In some embodiments, the first conductive layer 510 can be a polysilicon layer formed by a low pressure chemical vapor deposition LPCVD process. In some embodiments, the first conductive layer 510 can then be treated by a gas plasma process, such as an ammonia ($NH_3$) plasma treatment process. Further, the first conductive layer 510 treated by the plasma treatment process followed by a heavy doping process to implant with ex-situ arsenic ions (As) and/or boron ions (B).

Specifically, silane ($SiH_4$) and hydrogen ($H_2$) diluted with argon (Ar) and/or nitrogen ($N_2$) can be used as a precursor gas for the LPCVD process to deposit the polysilicon material. A batch furnace can used as a heating furnace of the LPCVD process. A reaction temperature in the heating furnace can be in a range from about 400° C. to about 800° C. A chamber pressure of the heating furnace can be in a range from about 0.1. Torr to about 1 Torr. The $NH_3$ plasma treatment process can be carried out in the PECVD chamber at a temperature in a range from about 300° C. to 600° C. Using $NH_3$ plasma treatment can terminate polysilicon surface dangling bonds, resulting an improved device mobility.

In some embodiments, during the operation S120, the wafer may undergo slight stress, causing the substrate 100 and the alternating conductive/dielectric stack 200 to bow within an acceptable range. For example, a wafer bow can be less than about 50 nm in the X-direction, and can be less than about 30 nm in the Y-direction.

Referring back to FIG. 1, the method proceeds to operation S130, in which a second conductive layer can be formed to cover the first conductive layer and fill the multiple slits. A doping process and an annealing process can be performed on the second conductive layer.

Figure 2C:
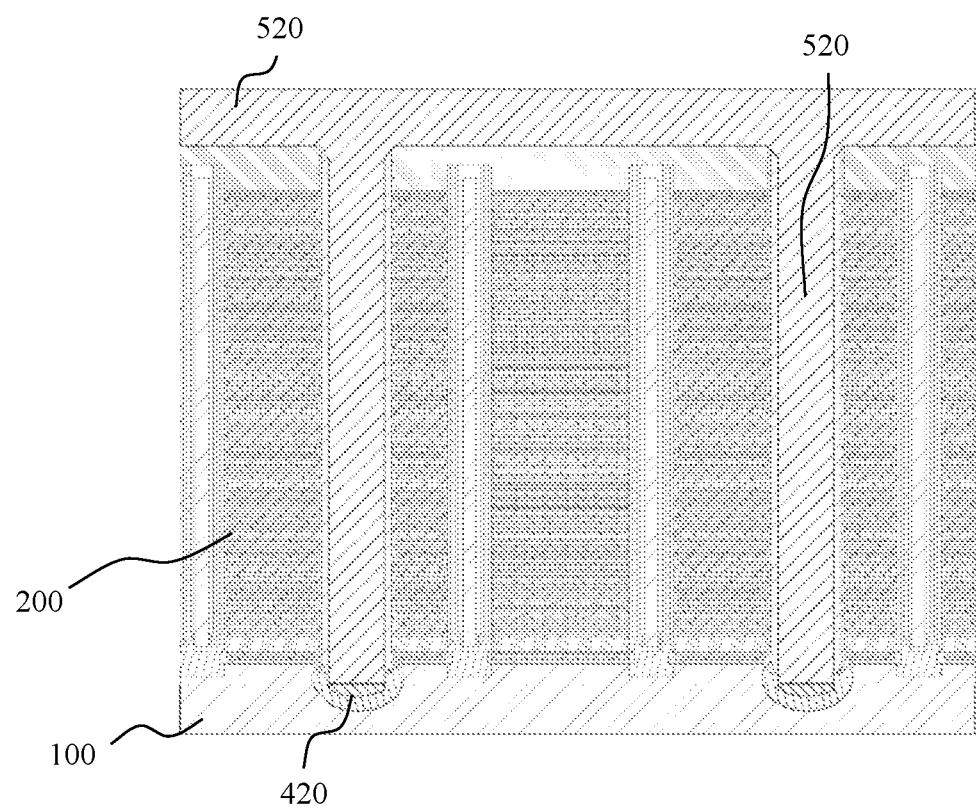

As shown in FIG. 2C, the second conductive layer 520 can be formed to cover the first conductive layer 510 and fill the slits 400. In some embodiments, the second conductive layer 520 can be a polysilicon layer formed by a low pressure chemical vapor deposition LPCVD process. In some embodiments, the process parameters for forming the second conductive layer 520 can be the same as the process parameters for forming the first conductive layer 510 described above. It is noted that, the second conductive layer 520 and the first conductive layer 510 can be formed under same or different fabricating conditions.

In some embodiments, the second conductive layer 520 can be a polysilicon layer heavily doped with arsenic ions (As) and/or boron ions (B). The annealing process can be a rapid thermal crystallization process including a spike annealing process and/or a flash annealing process at a temperature ranging from about 800° C. to about 1200° C. For example, a spike annealing process followed by a flash annealing process, a flash annealing process only, or a flash annealing process and/or a spike annealing process can be performed. The spike annealing can determine the position of the chemical profile and the activation can be increased by the subsequent diffusion-less flash annealing, along with maintenance of high degree of dopant activation. As such, the polysilicon layer can be partially crystallized, and conductivity of the polysilicon layer can be increased. It is noted that, the intrinsic resistivity of polysilicon is about 10 to 100 times higher than the intrinsic resistivity of tungsten (W) that is formed by a chemical vapor deposition (CVD) process. Thus, the polysilicon heavily doped with As and/or B ions can have an increased conductivity that matches the conductivity of tungsten (W).

In some embodiments, during the operation S130, the wafer may undergo slight stress, causing the substrate 100 and the alternating conductive/dielectric stack 200 to bow within an acceptable range. For example, a wafer bow can be less than about 15 nm in the X-direction, and can be about 0 nm in the Y-direction.

Referring back to FIG. 1, the method proceeds to operation S140, in which portions of the first conductive layer and the second conductive layer can removed to form a recess in each of the slits. A compensation doping process can be performed on the remaining portions of the first conductive layer and the second conductive layer.

Figure 2D:
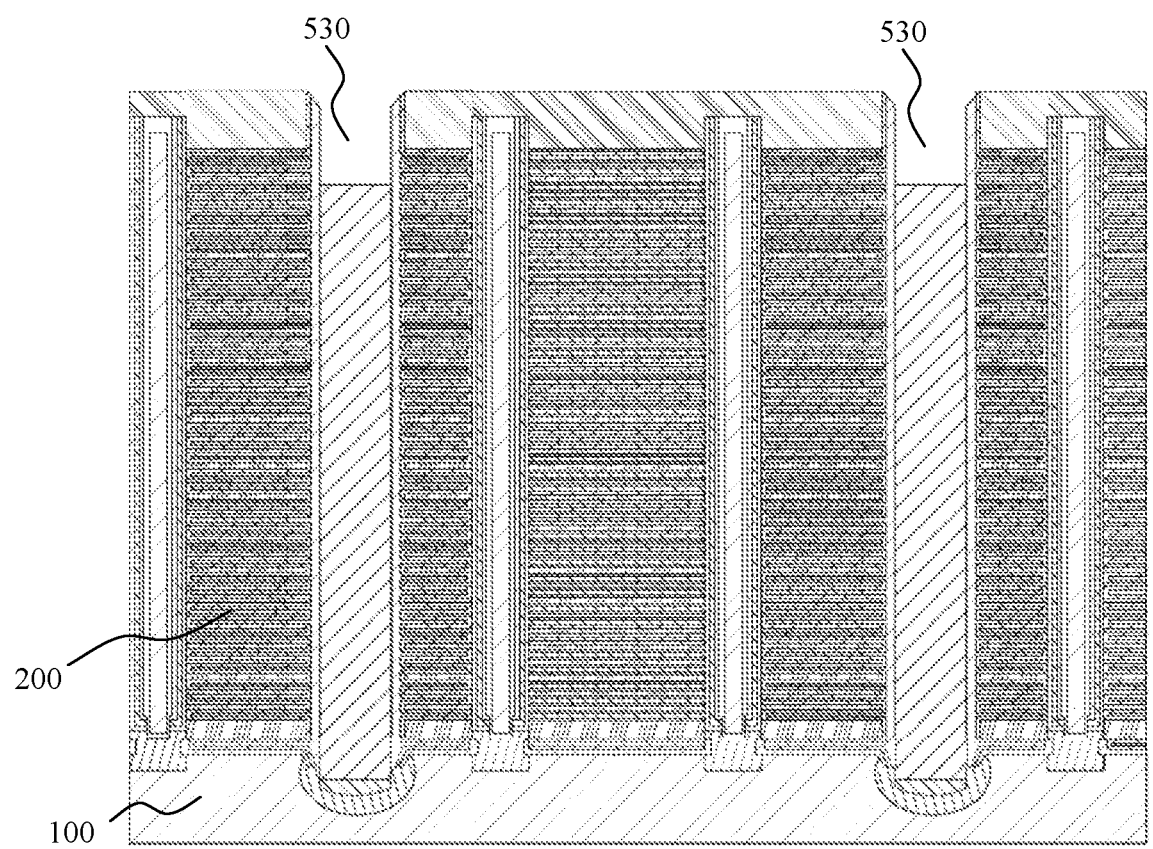

In some embodiments, the portions of first conductive layer 510 and the second conductive layer 520 that are outside of the multiple slits 400 can be removed. For example, the polysilicon layer on the back side and the front side of the wafer can be removed. An etch back process can be performed to remove an upper portion of the polysilicon layer in each slit, such that a recess 530 can be formed in each slit, as shown in FIG. 2D. A compensation doping process can be performed on the remaining portions of the polysilicon layer in each slit with As and/or B ions.

In some embodiments, during the operation S140, the wafer may undergo slight stress, causing the substrate 100 and the alternating conductive/dielectric stack 200 to bow within an acceptable range. For example, a wafer bow can be less than about 15 nm in the X-direction, and can be about 0 nm in the Y-direction.

Figure 2E:
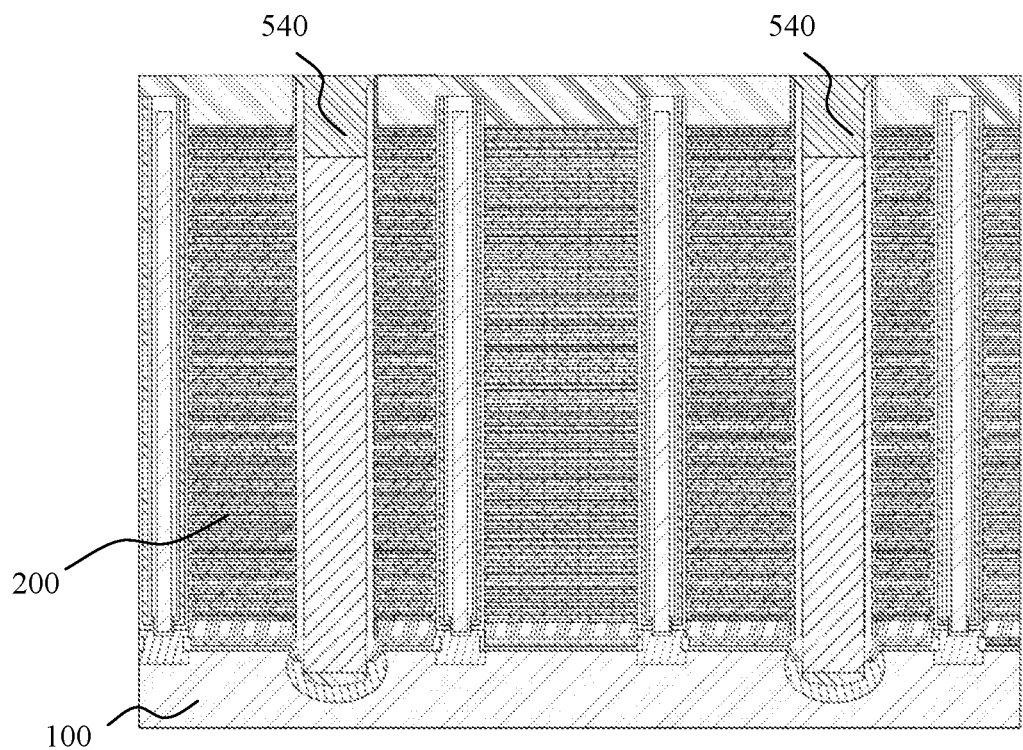

Referring back to FIG. 1, the method proceeds to operation S150, in which a third conductive layer 540 can be formed in the recess in each of the slits, as shown in FIG. 2E. In some embodiments, the third conductive layer 540 can be formed by using a deposition process and a chemical mechanical polishing (CMP) process. For example, a tungsten layer can be formed by a chemical vapor deposition (CVD) process. A CMP process can then be performed to planarize the top surface of the tungsten layer, as shown in FIG. 2E.

In some embodiments, during the operation S150, the wafer may undergo slight stress, causing the substrate 100 and the alternating conductive/dielectric stack 200 to bow within an acceptable range. For example, a wafer bow can be less than about 50 nm in the X-direction, and can be about 0 nm in the Y-direction.

Accordingly, the array common source structures shown in FIG. 2E can be formed by the disclosed fabricating method described above. Each common source structure can comprise a lower portion including the first conductive layer and the second conductive layer, and an upper portion including the third conductive layer. The lower portion can be heavily doped and rapidly annealed. For example, the lower portion of the common source structure can be LPCVD-polysilicon that is heavily doped with As/B and crystallized by rapid thermal annealing, and the upper portion of the common source structure can be CVD-tungsten.

The common source filling structure can significantly reduce the wafer stress and effectively improve the conductivity and device mobility of the common source of the polysilicon. The advantages of the above disclosed array common source structure of 3D memory device in controlling wafer stress are particularly clear compared to the conventional common source tungsten filling structures formed by the existing fabricating method. The conventional common source tungsten fill structures can cause extensive wafer stresses in both the X and Y directions, which can be up to several GPa. A comparative example prepared according to an existing fabricating method is provided below. The wafer stresses caused by each operations of the comparative example and the wafer stresses caused by each operation of the disclosed fabricating method are compared. The comparison shows that the disclosed method for forming array common source structures has a significant improvement in reducing the wafer stresses.

Figure 3:
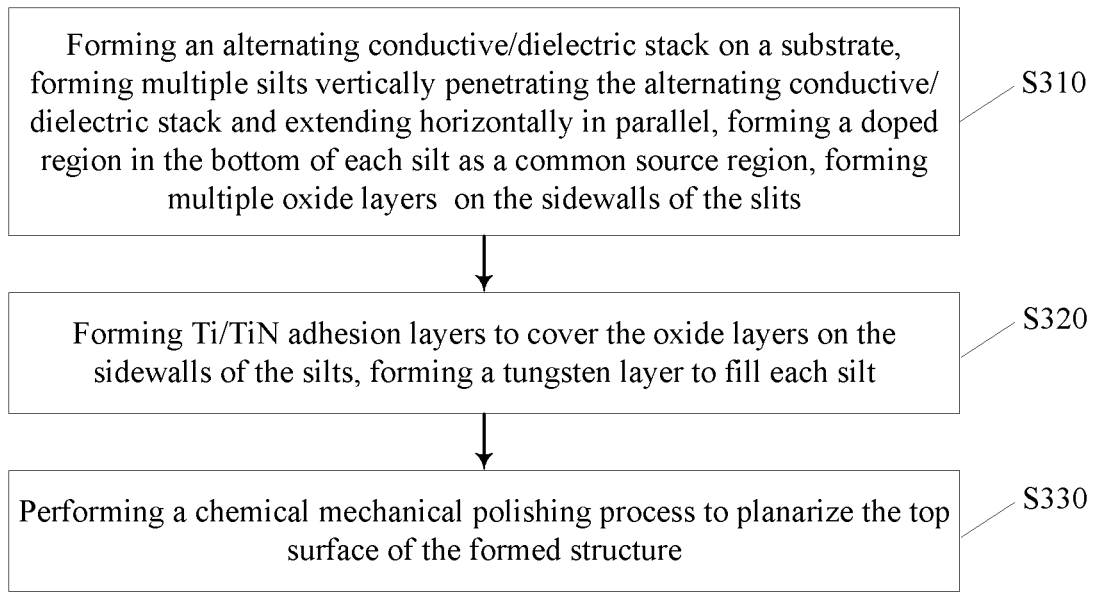
FIG. 3 illustrates a flow diagram of a method for forming an array common source structure of a 3D memory device.
Figure 4A:
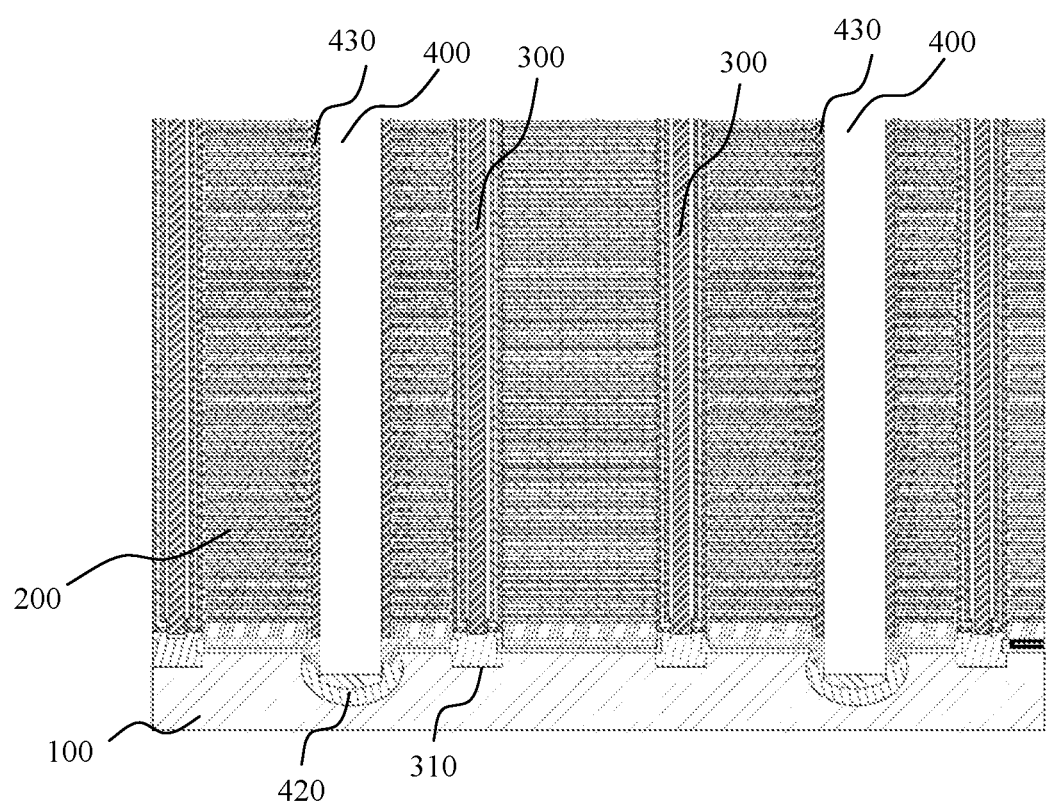
FIGS. 4A-4C illustrate cross-sectional views of a 3D memory device at certain fabricating stages of the method shown in FIG. 3.
Figure 4B:
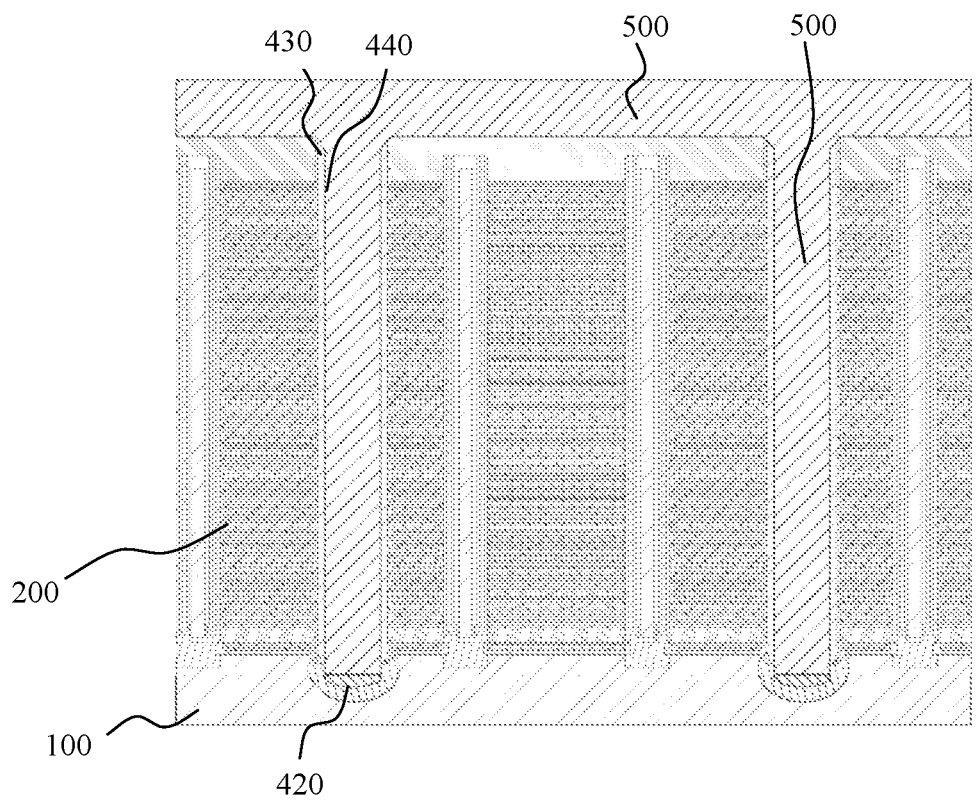
Figure 4C:
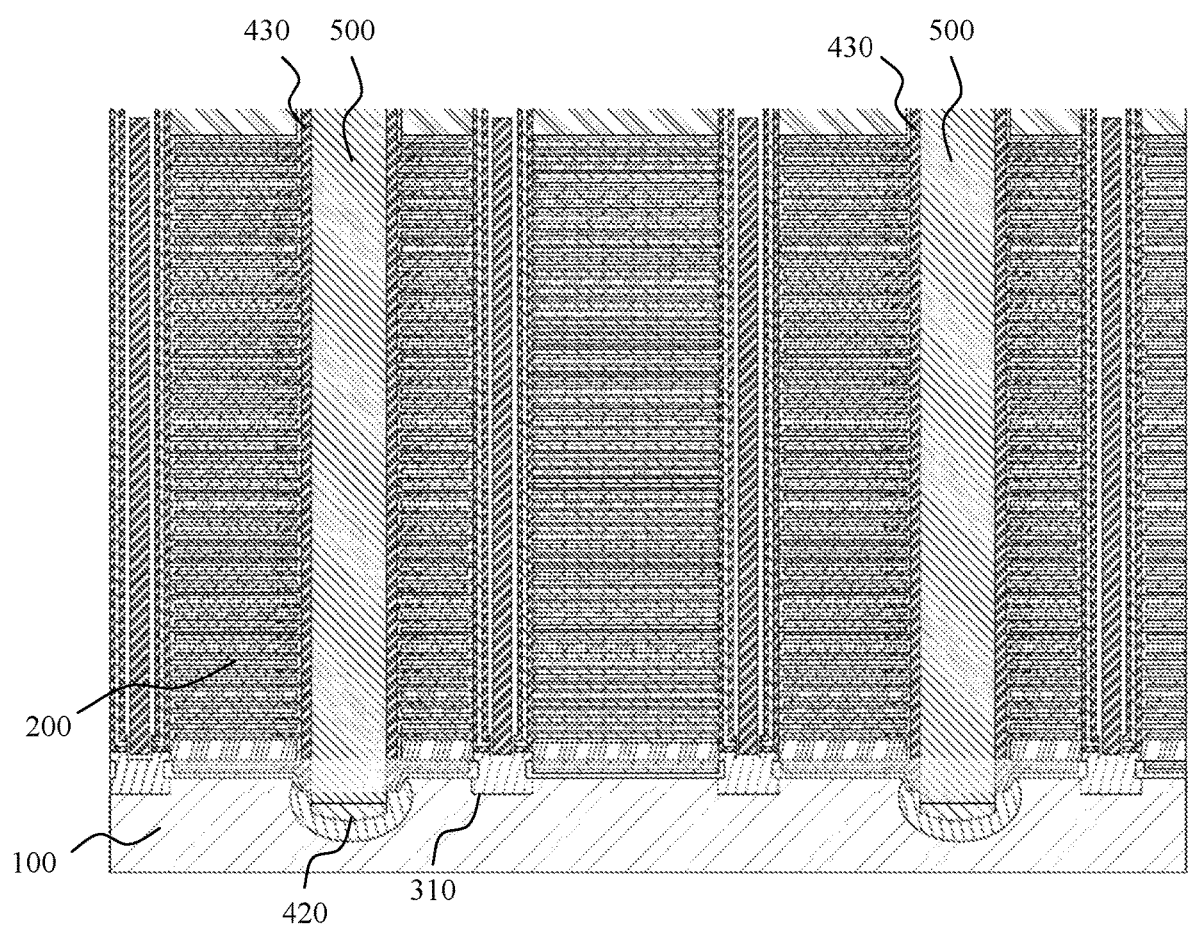

Referring to FIG. 3, a flow diagram of an exemplary method for forming an array common source structure of 3D memory device is shown. FIGS. 4A-4C illustrate cross-sectional views of an exemplary 3D memory device at certain fabricating stages of the method shown in FIG. 3.

As shown in FIG. 3, the method starts at operation S310, in which an alternating conductive/dielectric stack 200 can be formed on a substrate 100, as shown in FIG. 4A. Further, multiple channel structures 300 can be formed in the alternating conductive/dielectric stack 200 and arranged in an array. Multiple slits 400 vertically penetrating the alternating conductive/dielectric stack 200 can be formed and extended horizontally in parallel with each other. A doped region 420 can be formed in the bottom of each slit 400 as a common source region. Multiple oxide layers 430 can be formed on the sidewalls of the gate line slits. The details of the operation S310 can be referred to the description of operation S110 above in connection with FIG. 1. As described above, during the operation S310, the wafer may undergo slight stress, causing the substrate 100 and the alternating conductive/dielectric stack 200 to bow within an acceptable range. For example, a wafer bow can be less than about 40 nm in the X-direction, and can be less than about 50 nm in the Y-direction.

Referring back to FIG. 3, the method proceeds to operation S320, in which Ti/TiN adhesion layers 440 are formed to cover the oxide layers 430 on the sidewalls of the slits 400, as shown in FIG. 4B. A tungsten layer 500 can be formed to fill each slit 400. The Ti/TiN adhesion layers 440 are used for improving the adhesion of the tungsten layers 500. The tungsten layers 500 are formed by using a CVD process. It is noted that, during the operation S320, the wafer may undergo heavy stress, causing the substrate 100 and the alternating conductive/dielectric stack 200 to bow to a large degree. For example, a wafer bow is larger than 300 nm in the X-direction, and is larger than 150 nm in the Y-direction. Such wafer warpage can cause lithography defocusing and many other problems.

Referring back to FIG. 3, the method proceeds to operation S330, in which a chemical mechanical polishing (CMP) process is performed to planarize the top surface of the formed structure, as shown in FIG. 4C. As such, the formed array common source structure includes CVD-tungsten. Similarly, during the operation S330, the wafer may undergo heavy stress, causing the substrate 100 and the alternating conductive/dielectric stack 200 to bow to a large degree. For example, a wafer bow is larger than 300 nm in the X-direction, and is larger than 150 nm in the Y-direction. Such wafer warpage can cause lithography defocusing and many other problems.

Table 1 below shows wafer bow resulting from the operations in the disclosed method of the present application described above in connection with FIGS. 1 and 2A-2E. Table 2 below shows the wafer bow resulting from the operations in the comparative example described above in connection with FIGS. 3 and 4A-4C.

TABLE 1

| | Wafer (μm) | | | | |
|---|---|---|---|---|---|
| | Operation S110 | Operation S120 | Operation S130 | Operation S140 | Operation S150 |
| X-direction | <40 | <50 | <15 | <15 | <50 |
| Y-direction | <50 | <30 | <0 | <0 | <0 |

TABLE 2

| | Wafer (μm) | | |
|---|---|---|---|
| | Operation S310 | Operation S320 | Operation S330 |
| X-direction | <40 | >300 | >300 |
| Y-direction | <50 | >150 | >150 |

As seen from the comparison of Table 1 and Table 2, the disclosed method for forming the array common source structures has a significant improvement in reducing the wafer stresses. As such, the problems including wafer warpage, wafer sliding, lithography defocusing, cladding misalignment, etc. that are caused by large wafer stresses can be eliminated.

Accordingly, array common source structures of three-dimensional (3D) memory devices and fabricating methods thereof are provided.

One aspect of the present disclosure provides a method for forming a three-dimensional (3D) memory device, comprising: forming an alternating conductive/dielectric stack on a substrate; forming a slit vertically penetrating the alternating conductive/dielectric stack; forming an isolation layer on a sidewall of the slit; forming a first conductive layer covering the isolation layer; performing a plasma treatment followed by a first doping process to the first conductive layer; forming a second conductive layer covering the first conductive and filling the slit; performing a second doping process followed by a rapid thermal crystallization process to the second conductive layer; removing an upper portion of the first conductive layer and the second conductive layer to form a recess in the slit; and forming a third conductive layer in the recess.

In some embodiments, forming the alternating conductive/dielectric stack comprises: forming at least 32 conductive/dielectric layer pairs stacked in a vertical direction, wherein each conductive/dielectric layer pair includes a conductive layer and a dielectric layer. In some embodiments, forming the alternating conductive/dielectric stack comprises: forming at least 32 conductive/dielectric layer pairs stacked in a vertical direction, wherein each conductive/dielectric layer pair includes a tungsten layer and a silicon oxide layer.

In some embodiments, the method further comprises: forming an array of channel structures, each vertically penetrating the first alternating conductive/dielectric stack; and forming a plurality of slits extending in a horizontal direction in parallel with each other to separate the array of channel structures into a plurality of subsets.

In some embodiments, forming the array of channel structures comprises: forming an array of channel holes, each vertically penetrating the alternating conductive/dielectric stack; forming an epitaxial layer at a bottom of each channel hole; forming a functional layer on a sidewall of each channel hole; forming a channel layer covering a sidewall of the functional layer, the channel layer being in contact with the epitaxial layer in each channel hole; and forming a filling structure covering a sidewall of the channel layer and filling each channel hole.

In some embodiments, the method further comprises: forming a doped region at a bottom of the slit.

In some embodiments, forming the first conductive layer comprises: using a low pressure chemical vapor deposition (LPCVD) process to form a first polysilicon layer.

In some embodiments, forming the first conductive layer further comprises: using a mixture of silane and hydrogen diluted with argon or nitrogen as a precursor gas for the LPCVD process; and using a batch furnace as a heating furnace of the LPCVD process set to a reaction temperature in a range from about 400° C. to about 800° C. and a chamber pressure to a range from about 0.1. Torr to about 1 Torr.

In some embodiments, performing the plasma treatment followed by the first doping process to the first conductive layer comprises: performing a $NH_3$ plasma treatment to the first polysilicon layer; and performing a first heavy doping process to the first polysilicon layer with arsenic ions or boron ions.

In some embodiments, performing the $NH_3$ plasma treatment to the first polysilicon layer comprises: performing a plasma-enhanced chemical vapor deposition furnace at a temperature in a range from about 300° C. to 600° C.

In some embodiments, forming the second conductive layer comprises: after the doping process to the first conductive layer, using a low pressure chemical vapor deposition (LPCVD) process to form a second polysilicon layer to cover the first conductive and filling the slit.

In some embodiments, performing the second doping process followed by the rapid thermal crystallization process to the second conductive layer comprises: performing a second heavy doping process to the second polysilicon layer with arsenic ions or boron ions; and performing a spike annealing process or a flash annealing process to the doped second conductive layer.

In some embodiments, performing a spike annealing process or a flash annealing process to the doped second conductive layer comprises: performing a spike annealing process or a flash annealing process at a temperature ranging from about 800° C. to about 1200° C., such that the arsenic or boron ions dopant is effectively activated and the second polysilicon layer is partially crystallized.

In some embodiments, performing a spike annealing process or a flash annealing process to the doped second conductive layer comprises: performing a spike annealing process first and a flash annealing process second to the doped second conductive layer; or performing a flash annealing process first and a spike annealing process second to the doped second conductive layer.

In some embodiments, the method further comprises: after removing the upper portion of the first conductive layer and the second conductive layer to form the recess in the slit, performing a compensation doping process to a remaining portion of the first conductive layer and the second conductive layer.

In some embodiments, the compensation doping process comprises: performing a heavy doping process to the remaining portion of the first conductive layer and the second conductive layer with arsenic ions or boron ions.

In some embodiments, forming the third conductive layer in the recess comprises: depositing a tungsten layer in the recess; and performing a chemical mechanical polishing process to planarize a top surface of the tungsten layer.

Another aspect of the present disclosure provides a three-dimensional (3D) memory device, comprising: an alternating conductive/dielectric stack on a substrate; a slit vertically penetrating the alternating conductive/dielectric stack; an isolation layer on a sidewall of the slit; a common source structure in the slit including: a lower portion including: a first conductive layer covering the isolation layer, the first conductive layer being treated by a plasma treatment followed by a doping process, and a second conductive layer covering the first conductive and filling the slit, the second conductive layer being treated by a doping process followed by a rapid thermal crystallization process; and an upper portion including a third conductive layer.

In some embodiments, the alternating conductive/dielectric stack comprises: at least 32 conductive/dielectric layer pairs stacked in a vertical direction, wherein each conductive/dielectric layer pair includes a conductive layer and a dielectric layer. In some embodiments, the alternating conductive/dielectric stack comprises: at least 32 conductive/dielectric layer pairs stacked in a vertical direction, wherein each conductive/dielectric layer pair includes a tungsten layer and a silicon oxide layer.

In some embodiments, the device further comprises: an array of channel structures, each vertically penetrating the first alternating conductive/dielectric stack; and a plurality of slits extending in a horizontal direction in parallel with each other to separate the array of channel structures into a plurality of subsets.

In some embodiments, each channel structures comprises: a channel hole vertically penetrating the alternating conductive/dielectric stack; an epitaxial layer at a bottom of each channel hole; a functional layer on a sidewall of each channel hole; a channel layer covering a sidewall of the functional layer and being in contact with the epitaxial layer; and a filling structure covering a sidewall of the channel layer and filling the channel hole.

In some embodiments, the device further comprises: a doped region at a bottom of the slit.

In some embodiments, the first conductive layer is a first polysilicon layer including arsenic ions or boron ions. The second conductive layer is a second polysilicon layer including arsenic ions or boron ions and at least partially crystallized. The third conductive layer is a tungsten layer.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
   forming an alternating conductive/dielectric stack on a substrate;
   forming a slit vertically penetrating the alternating conductive/dielectric stack;
   forming an isolation layer on a sidewall of the slit;
   forming a first conductive layer covering the isolation layer;
   performing a plasma treatment followed by a first doping process to the first conductive layer;
   forming a second conductive layer covering the first conductive layer and filling the slit;
   performing a second doping process followed by a rapid thermal crystallization process to the second conductive layer;
   removing an upper portion of the first conductive layer and the second conductive layer to form a recess in the slit; and
   forming a third conductive layer in the recess.

2. The method of claim 1, further comprising:
   forming an array of channel structures, each vertically penetrating the first alternating conductive/dielectric stack; and
   forming a plurality of slits extending in a horizontal direction in parallel with each other to separate the array of channel structures into a plurality of subsets.

3. The method of claim 2, wherein forming the array of channel structures comprises:
   forming an array of channel holes, each vertically penetrating the alternating conductive/dielectric stack;
   forming an epitaxial layer at a bottom of each channel hole;
   forming a functional layer on a sidewall of each channel hole;
   forming a channel layer covering a sidewall of the functional layer, the channel layer being in contact with the epitaxial layer in each channel hole; and
   forming a filling structure covering a sidewall of the channel layer and filling each channel hole.

4. The method of claim 1, further comprising:
forming a doped region at a bottom of the slit.

5. The method of claim 1, wherein forming the first conductive layer comprises:
using a low pressure chemical vapor deposition (LPCVD) process to form a first polysilicon layer.

6. The method of claim 5, wherein forming the first conductive layer further comprises:
using a mixture of silane and hydrogen diluted with argon or nitrogen as a precursor gas for the LPCVD process; and
using a batch furnace as a heating furnace of the LPCVD process set to a reaction temperature in a range from about 400° C. to about 800° C. and a chamber pressure to a range from about 0.1 Torr to about 1 Torr.

7. The method of claim 5, wherein performing the plasma treatment followed by the first doping process to the first conductive layer comprises:
performing a $NH_3$ plasma treatment to the first polysilicon layer; and
performing a first heavy doping process to the first polysilicon layer with arsenic ions or boron ions.

8. The method of claim 7, wherein performing the $NH_3$ plasma treatment to the first polysilicon layer comprises:
performing a plasma-enhanced chemical vapor deposition furnace at a temperature in a range from about 300° C. to 600° C.

9. The method of claim 5, wherein forming the second conductive layer comprises:
after the doping process to the first conductive layer, using a low pressure chemical vapor deposition (LPCVD) process to form a second polysilicon layer to cover the first conductive layer and filling the slit.

10. The method of claim 9, wherein performing the second doping process followed by the rapid thermal crystallization process to the second conductive layer comprises:
performing a second heavy doping process to the second polysilicon layer with arsenic ions or boron ions; and
performing a spike annealing process or a flash annealing process to the doped second conductive layer.

11. The method of claim 10, wherein performing a spike annealing process or a flash annealing process to the doped second conductive layer comprises:
performing a spike annealing process or a flash annealing process at a temperature ranging from about 800° C. to about 1200° C., such that the arsenic or boron ions dopant is effectively activated and the second polysilicon layer is partially crystallized.

12. The method of claim 10, wherein performing a spike annealing process or a flash annealing process to the doped second conductive layer comprises:
performing a spike annealing process first and a flash annealing process second to the doped second conductive layer; or
performing a flash annealing process first and a spike annealing process second to the doped second conductive layer.

13. The method of claim 1, further comprising:
after removing the upper portion of the first conductive layer and the second conductive layer to form the recess in the slit, performing a compensation doping process to a remaining portion of the first conductive layer and the second conductive layer.

14. The method of claim 13, wherein the compensation doping process comprises:
performing a heavy doping process to the remaining portion of the first conductive layer and the second conductive layer with arsenic ions or boron ions.

15. The method of claim 1, wherein forming the third conductive layer in the recess comprises:
depositing a tungsten layer in the recess; and
performing a chemical mechanical polishing process to planarize a top surface of the tungsten layer.

16. A three-dimensional (3D) memory device, comprising:
an alternating conductive/dielectric stack on a substrate;
a slit vertically penetrating the alternating conductive/dielectric stack;
an isolation layer on a sidewall of the slit;
a common source structure in the slit including:
a lower portion including:
a first conductive layer covering the isolation layer, the first conductive layer being treated by a plasma treatment followed by a doping process, and
a second conductive layer covering the first conductive layer and filling the slit, the second conductive layer being treated by a doping process followed by
a rapid thermal crystallization process; and
an upper portion including a third conductive layer.

17. The device of claim 16, further comprising:
an array of channel structures, each vertically penetrating the first alternating conductive/dielectric stack; and
a plurality of slits extending in a horizontal direction in parallel with each other to separate the array of channel structures into a plurality of subsets.

18. The device of claim 16, wherein each channel structure comprises:
a channel hole vertically penetrating the alternating conductive/dielectric stack;
an epitaxial layer at a bottom of each channel hole;
a functional layer on a sidewall of each channel hole;
a channel layer covering a sidewall of the functional layer and being in contact with the epitaxial layer; and
a filling structure covering a sidewall of the channel layer and filling the channel hole.

19. The device of claim 16, further comprising:
a doped region at a bottom of the slit.

20. The device of claim 16, wherein:
the first conductive layer is a first polysilicon layer including arsenic ions or boron ions;
the second conductive layer is a second polysilicon layer including arsenic ions or boron ions and at least partially crystallized; and
the third conductive layer is a tungsten layer.

* * * * *